(12) United States Patent
Lee et al.

(10) Patent No.: US 8,861,159 B2
(45) Date of Patent: Oct. 14, 2014

(54) SEMICONDUCTOR DEVICE AND SYSTEMS INCLUDING THE SAME

(75) Inventors: Seong-Jin Lee, Hwaseong-si (KR); Jang Seok Choi, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 349 days.

(21) Appl. No.: 13/227,060

(22) Filed: Sep. 7, 2011

(65) Prior Publication Data

US 2012/0106011 A1 May 3, 2012

(30) Foreign Application Priority Data

Nov. 3, 2010 (KR) .................. 10-2010-0108784

(51) Int. Cl.
*H01L 23/62* (2006.01)

(52) U.S. Cl.
USPC ............. 361/91.1; 361/56; 257/774; 257/777

(58) Field of Classification Search
USPC ............... 361/56, 91.1; 257/774, 777
See application file for complete search history.

(56) References Cited

U.S. PATENT DOCUMENTS

| | | | | |
|---|---|---|---|---|
| 5,336,908 A | * | 8/1994 | Roberts | 257/173 |
| 5,869,869 A | * | 2/1999 | Hively | 257/355 |
| 6,018,183 A | * | 1/2000 | Hsu | 257/355 |
| 6,097,045 A | * | 8/2000 | Min | 257/233 |
| 6,133,626 A | * | 10/2000 | Hawke et al. | 257/686 |
| 7,076,089 B2 | * | 7/2006 | Brandt et al. | 382/124 |
| 7,271,629 B2 | * | 9/2007 | Jeon et al. | 327/112 |
| 7,704,874 B1 | * | 4/2010 | Kar-Roy et al. | 438/637 |
| 7,791,207 B2 | * | 9/2010 | Hiatt | 257/774 |
| 7,872,346 B1 | * | 1/2011 | Chee et al. | 257/691 |
| 7,965,482 B2 | * | 6/2011 | Watanabe | 361/56 |
| 8,110,875 B2 | * | 2/2012 | Ellis-Monaghan et al. | 257/355 |
| 2004/0070083 A1 | * | 4/2004 | Su | 257/778 |

FOREIGN PATENT DOCUMENTS

| | | |
|---|---|---|
| JP | 07-106522 | 4/1995 |
| JP | 2000-133775 | 5/2000 |
| KR | 10-0638887 B1 | 10/2006 |

* cited by examiner

*Primary Examiner* — Zeev V Kitov
(74) *Attorney, Agent, or Firm* — Muir Patent Consulting, PLLC

(57) ABSTRACT

The semiconductor device is provided. The semiconductor device includes a substrate, an electrostatic discharge layer disposed on the substrate and including a plurality of electrostatic discharge circuits, at least one semiconductor chip stacked on the electrostatic discharge layer, and a plurality of vertical electrical connections which pass through the at least one semiconductor chip and the electrostatic discharge layer to connect the at least one semiconductor chip to the semiconductor substrate. The vertical electrical connections are connected to the electrostatic discharge circuits, respectively.

20 Claims, 10 Drawing Sheets

SEMICONDUCTOR DEVICE AND SYSTEMS INCLUDING THE SAME

CROSS-REFERENCE TO RELATED APPLICATIONS

This application claims priority under 35 U.S.C. §119(a) to Korean Patent Application No. 10-2010-0108784 filed on Nov. 3, 2010, the disclosure of which is hereby incorporated by reference in its entirety.

BACKGROUND

Embodiments disclosed herein relate to a semiconductor device, and more particularly, to a semiconductor device including an electrostatic discharge (ESD) layer between a semiconductor package substrate and a semiconductor chip in the package, a method of fabricating the same, and systems including the same.

With the development of through-silicon via (TSV) technology in memory chips, the number of input/output (I/O) pads between a processor or a controller and a memory chip has increased. Also, with the continuous shrinkage of the size of the memory chip, the cross-sectional area of the memory chip has been reduced. In this trend, the area occupied by I/O pads and TSVs is limited in the memory chip.

SUMMARY

Some disclosed embodiments provide a semiconductor device which includes an electrostatic discharge (ESD) layer between a semiconductor package substrate and at least one semiconductor chip, thereby protecting an internal circuit formed on the at least one semiconductor chip, a method of fabricating the semiconductor device, and systems including the same.

According to one embodiments, there is provided a semiconductor device including a substrate, an electrostatic discharge layer disposed on the substrate and including a plurality of electrostatic discharge circuits, at least one semiconductor chip stacked on the electrostatic discharge layer, and a plurality of vertical electrical connections which pass through the at least one semiconductor chip and the electrostatic discharge layer to connect the at least one semiconductor chip to the substrate. The vertical electrical connections are connected to the electrostatic discharge circuits, respectively.

Each of the electrostatic discharge circuits may include at least one diode connected to a respective vertical electrical connection. Further, each of the electrostatic discharge circuits may include at least one diode-connected transistor connected to a respective vertical electrical connection.

Each of the electrostatic discharge circuits may include a first diode connected between a corresponding one of the vertical electrical connections and a power line supplying a power supply and a second diode connected between the corresponding one of the vertical electrical connections and a ground.

A cathode of the first diode may be connected to the power line and an anode of the first diode may be connected to the corresponding one of the vertical electrical connections. A cathode of the second diode may be connected to the corresponding one of the vertical electrical connections and an anode of the second diode may be connected to the ground.

Each of the vertical electrical connections may be a via or a through via. The semiconductor device may be a package, and the substrate may be a package substrate.

According to other embodiments, there is provided a memory module including the above-described semiconductor device and a module substrate on which the semiconductor device is mounted.

According to further embodiments, there is provided a memory system including the above-described semiconductor device and a memory controller configured to control an operation of the semiconductor device.

In other embodiments, a memory system includes the above-described memory module, a slot which is mounted on a main board and into which the memory module is inserted, and a processor mounted on the main board to control an operation of the semiconductor device included in the memory module through the slot.

In yet other embodiments, a semiconductor package is provided. The semiconductor package includes a package substrate, the package substrate having external terminals at a first surface, and connected to a plurality of through substrate vias at a second, opposite surface; a first set of one or more semiconductor chips including at least a first semiconductor chip, the first set of one or more semiconductor chips stacked on the second surface of the package substrate, the first semiconductor chip connected to the plurality of through substrate vias; a second semiconductor chip disposed between the package substrate and the first set of one or more semiconductor chips, the second semiconductor chip including a plurality of electrostatic discharge circuits. Each electrostatic discharge circuit is electrically connected to at least one of the through substrate vias In a further embodiment, a semiconductor memory device is provided. The semiconductor memory device includes a device substrate; at least one memory chip disposed on the device substrate; an electrostatic discharge (ESD) chip disposed between the device substrate and the at least one memory chip; and through vias connected to the device substrate and the at least one memory chip and passing through the ESD chip. The ESD chip includes a set of one or more electrostatic discharge circuits connected to the through vias.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE EMBODIMENTS

Figure 1:
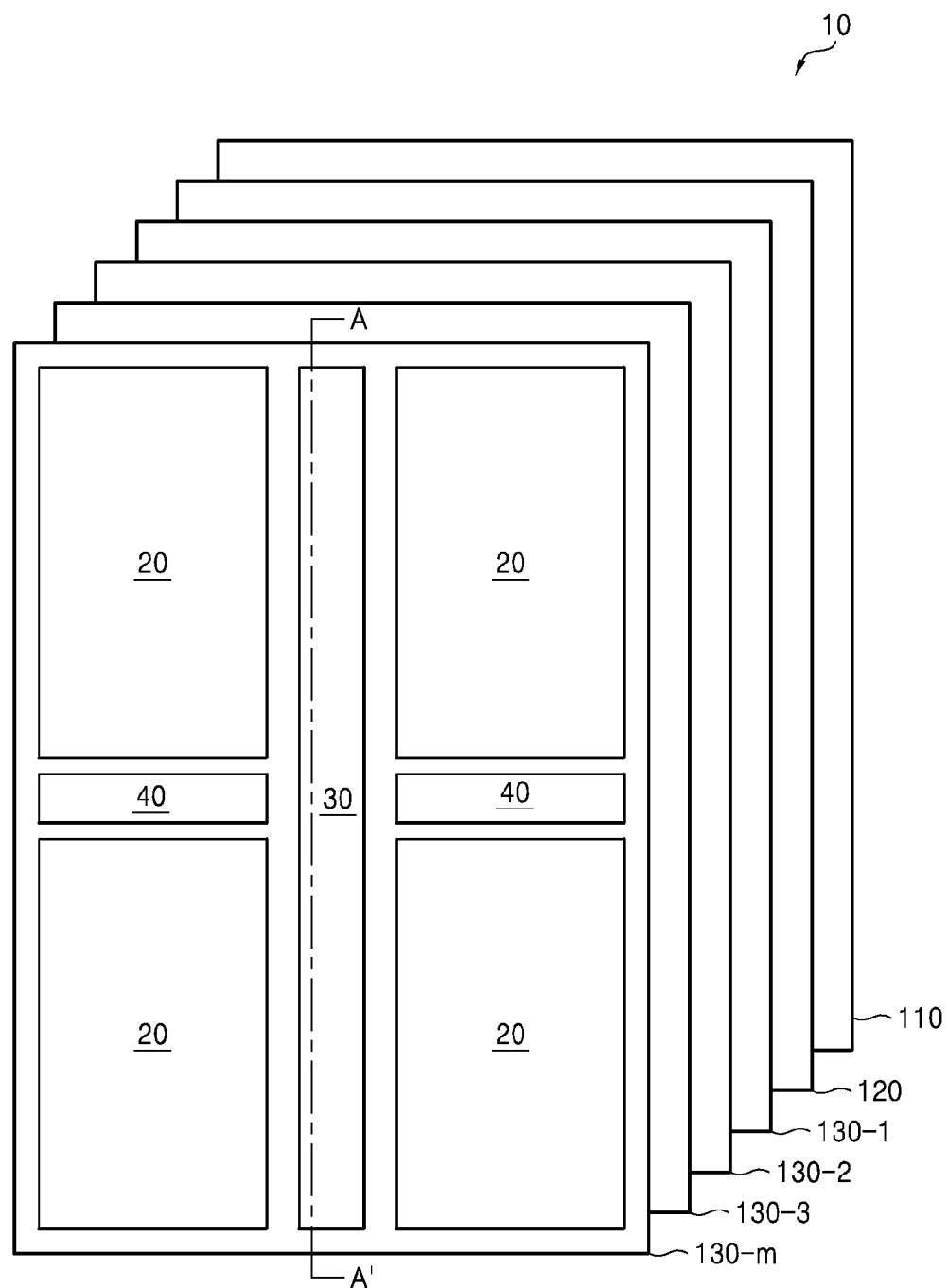
FIG. 1 is a plan view of a semiconductor device according to certain exemplary embodiments.

The present disclosure now will be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
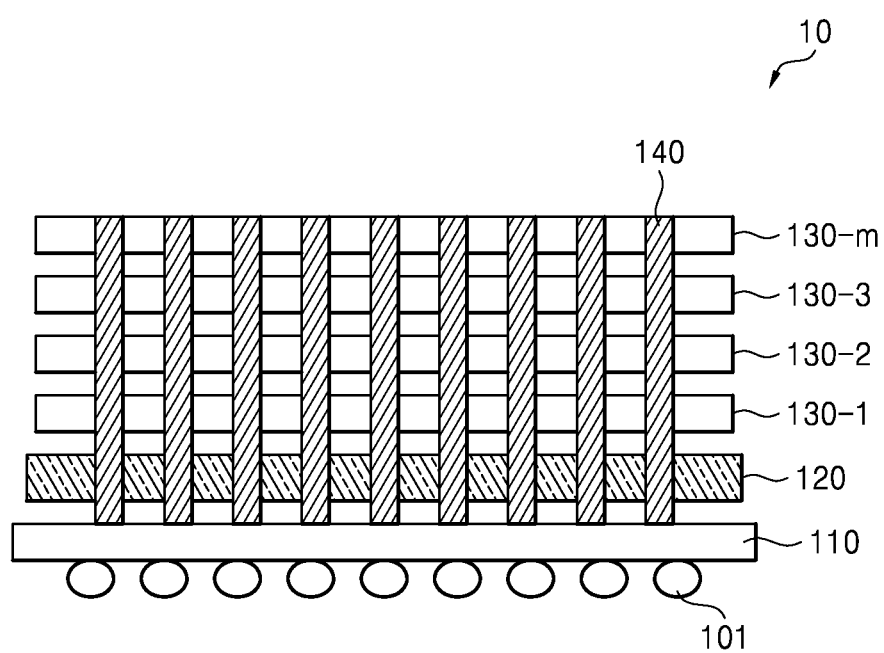
FIG. 2 is a partial cross-sectional view of the semiconductor device according to certain exemplary embodiments, taken along the line A-A' illustrated in FIG. 1.

FIG. 1 is a plan view of a semiconductor device 10 according to certain exemplary embodiments. FIG. 2 is a partial cross-sectional view of the semiconductor device 10, taken along the line A-A' illustrated in FIG. 1. The semiconductor device 10 may be, for example, a semiconductor package including a package substrate and one or more chips. Referring to FIGS. 1 and 2, in one embodiment, the semiconductor device 10 includes a substrate 110, such as a package substrate, an electrostatic discharge (ESD) layer 120 on the substrate 110, and one or more semiconductor chip 130-1 through 130-$m$ stacked on the ESD layer 120. Each semiconductor chip may comprise a particular layer of the package, and thus may be referred to herein as a semiconductor chip layer. For clarity of the description, four semiconductor chip layers 130-1 through 130-$m$ (m=4) are illustrated in FIGS. 1 and 2, but the number of semiconductor chip layers or semiconductor chips stacked on the ESD layer 120 may be one or at least two.

The substrate 110 may include, for example, a plurality of upper terminals connected to the stacked semiconductor chip layers 130-1 through 130-$m$, via, for example, through vias. The upper terminals may be, for example, chip pads. The substrate may additionally include conductive patterns connecting the upper terminals to lower terminals disposed at a bottom of the substrate, and for connecting externally to a device or element outside the semiconductor device 10. For example, the lower terminals may be solder bumps or balls for connecting to a module board or system board.

As illustrated in FIGS. 1 and 2, in one embodiment, each of the four semiconductor chip layers 130-1 through 130-$m$ includes a plurality of core regions 20, a pad region 30, and a plurality of peripheral regions 40. As discussed above, the semiconductor device 10 may be implemented in a semiconductor package. As such, the semiconductor package may include one or more package substrates, and one or more semiconductor chips, and may be, for example, be a Package on Package (PoP), a Ball Grid Array (BGA), a Chip Scale Package (CSP), a Plastic Leaded Chip Carrier (PLCC), a Plastic Dual In-line Package (PDIP), a die in waffle pack, a die in wafer form, a Chip On Board (COB), a CERamic Dual In-line Package (CERDIP), a plastic Metric Quad Flat Pack (MQFP), a Thin Quad Flat Pack (TQFP), a Small Outline Integrated Circuit (SOIC), a Shrink Small Outline Package (SSOP), a Thins Small Outline Package (TSOP), a System In Package (SIP), a Multi Chip Package (MCP), a Wafer-level Fabricated Package (WFP), or a Wafer-level processed Stack Package (WSP).

In one embodiment, each of the four semiconductor chips is a memory chip, and each of the core regions 20 includes a plurality of word lines, a plurality of bit lines, and a plurality of memory cells, e.g., volatile or non-volatile memory cells, each connected to one of the word lines and one of the bit lines to store data. Each of the non-volatile memory cells may be implemented, for example, into electrically erasable programmable read-only memory (EEPROM), flash memory, magnetic random access memory (MRAM), spin-transfer torque MRAM, conductive bridging RAM (CBRAM), ferroelectric RAM (FeRAM), phase-change RAM (PRAM), resistive RAM (RRAM or ReRAM), nanotube RRAM, polymer RAM (PoRAM), nano floating gate memory (NFGM), holographic memory, molecular electronics memory device, or insulator resistance change memory. Each non-volatile memory cell may store a single bit or multiple bits. The semiconductor device 10 may therefore comprise a memory device, such as, for example, an SD card, a USB memory device, or a semiconductor memory package used in a larger system, such as, for example, a mobile phone, a PDA, laptop computer, or desktop computer.

Each of the peripheral regions 40 may include a write circuit (not shown) which writes data input through a plurality of connection terminals, e.g., vertical electrical connections 140, implemented in the pad region 30 to at least one corresponding core region among the core regions 20; or a read circuit (not shown) which transmits data output from the at least one corresponding core region among the core regions 20 to the connection terminals in the pad region 30. The vertical electrical connections 140 may be, for example, through vias, such as through substrate vias, or more specifically through silicon vias (TSVs) or through chip vias.

In one embodiment, the pad region 30 includes the connection terminals to transmit externally input data to the peripheral regions 40 and transmit data from the peripheral regions 40 to external devices. As illustrated in FIG. 2, in one embodiment, the connections, i.e., the vertical electrical connections 140 pass completely through the at least one semiconductor chip layer 130-1 through 130-m and the ESD layer 120 to electrically connect the at least one semiconductor chip layer 130-1 through 130-m with the substrate 110. However, in other embodiments, for certain of the chip layers 130-1 through 130-m or for the ESD layer 120, the vertical electrical connections 140 may pass only partly through the layer, and may connect to a next layer in part by a wire or other conductor, such as a redistribution line, for example.

Figure 3:
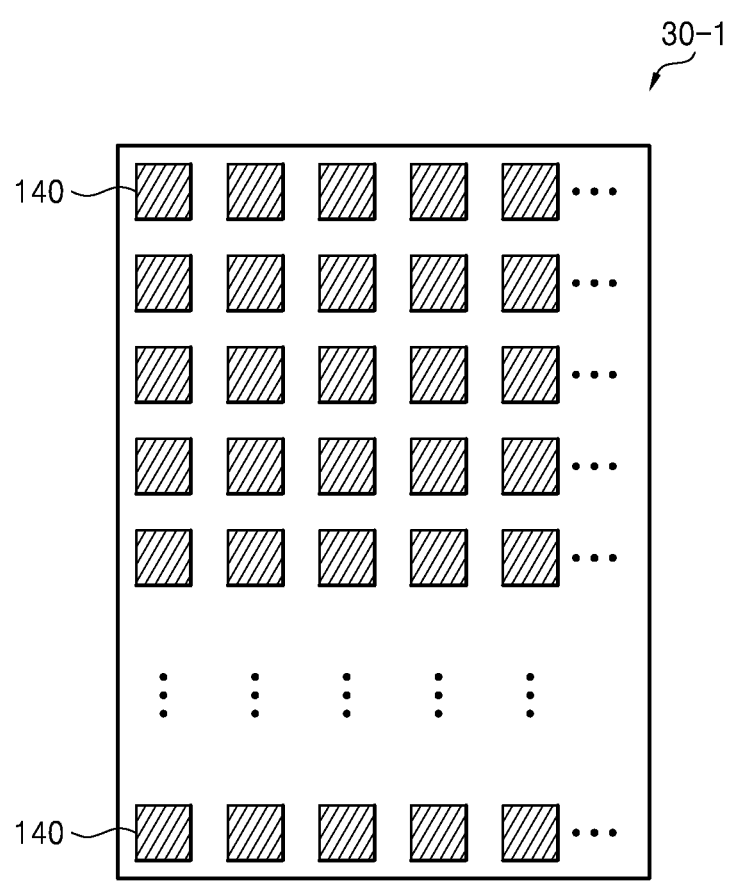
FIG. 3 is an enlarged plan view of a pad region on a semiconductor chip illustrated in FIG. 1, according to certain exemplary embodiments.

FIG. 3 is a plan view of an enlarged pad region 30-1 on each of the at least one semiconductor chip layer 130-1 through 130-m illustrated in FIG. 1, according to one exemplary embodiment. Referring to FIGS. 2 and 3, the enlarged pad region 30-1 includes the vertical electrical connections 140, e.g., through vias. A plurality of connection terminals 101, e.g., solder balls, a ball grid array, or bumps, may be implemented on the substrate 110 to correspond and electrically connect to the vertical electrical connections 140.

Figure 4:
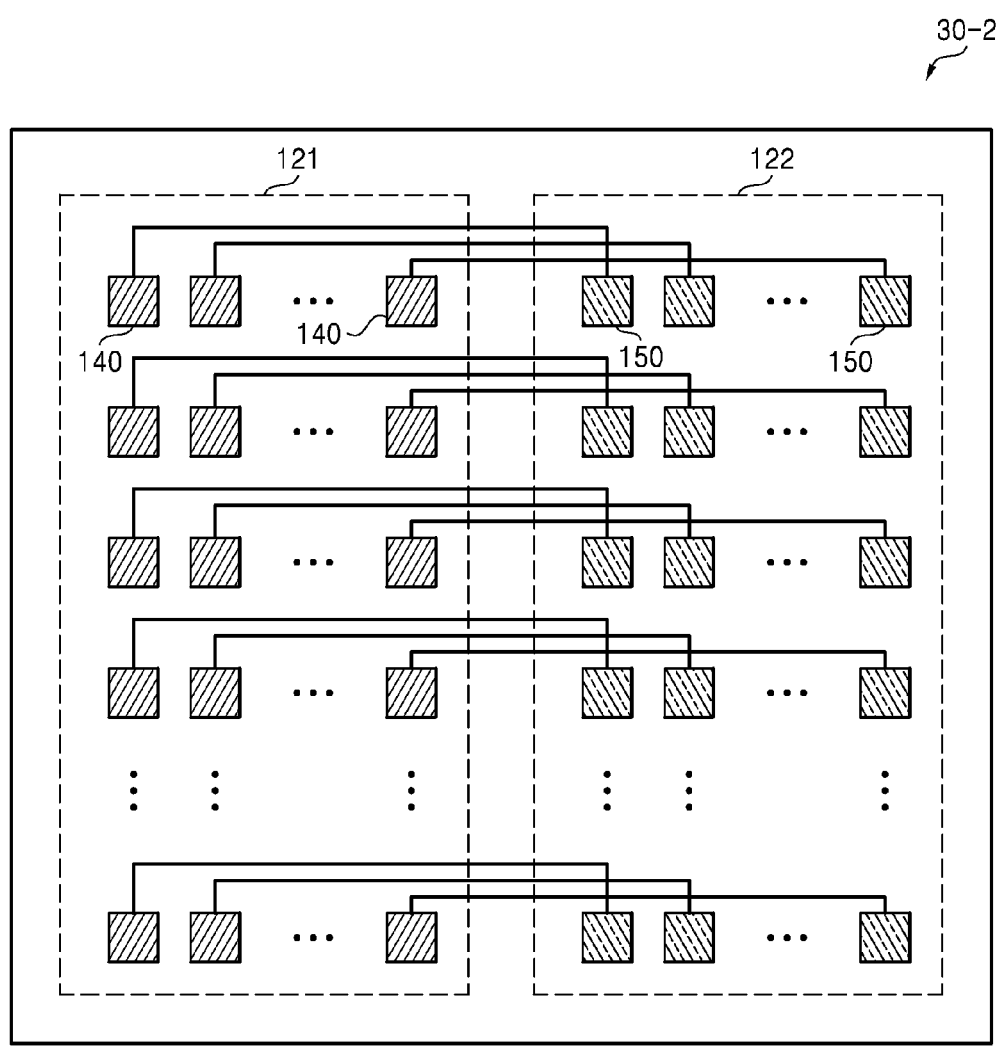
FIG. 4 is an enlarged plan view of a pad region on an electrostatic discharge (ESD) layer illustrated in FIG. 1, according to certain exemplary embodiments.

FIG. 4 is an enlarged plan view of a pad region 30-2 on the ESD layer 120 illustrated in FIG. 1, according to one embodiment. Referring to FIGS. 1 and 4, in one embodiment, the ESD layer 120 has the same structure as the semiconductor chip layers 130-1 through 130-m, except for the pad region 30-2. For example, in one embodiment, the ESD layer 120 is an ESD chip that includes a plurality of core regions substantially the same as the core regions 20 and a plurality of peripheral regions substantially the same as the peripheral regions 40, but has a pad region that differs from the pad region of the semiconductor chip layers 130-1 through 130-m.

In one exemplary embodiment, the pad region 30-2 of the ESD layer 120 includes a vertical electrical connection region 121 and an ESD circuit region 122. The vertical electrical connection region 121 includes a plurality of vertical electrical connections, for example through vias 140, and the ESD circuit region 122 includes a plurality of ESD circuits 150.

The ESD circuits 150 are electrically connected with the through vias 140, respectively, in the vertical electrical connection region 121. The ESD circuits 150 may be connected to the through vias 140 using, for example, one or more metal lines or circuit patterns.

For example, each ESD circuit 150 may correspond to one through via 140 and may be connected to the through via 140 using a metal circuit pattern. Alternatively, however, for certain through vias 140, more than one through via 140 may be connected to a single one of the ESD circuits 150. The ESD circuits 150 may be in a region that is adjacent to and beside the vertical electrical connection region 121, as shown in FIG. 4. However, in other embodiments, the ESD circuits 150 may be located, for example, in a region that surrounds the vertical electrical connection region 121, or in a region adjacent to two or more sides of the vertical electrical connection region 121.

In addition, although the ESD layer 120 is described above in one embodiment as including the same core regions 20 and peripheral regions 40 as the semiconductor chips 130, the ESD layer 120 may alternatively include different regions. For example, the semiconductor chips 130 may be memory chips, and ESD layer 120 may also be a memory chip. In addition, semiconductor chips 130 may be memory chips, such as slave memory chips, and ESD layer 120 may be a master memory chip, that includes logic circuitry and control functionality in addition to memory storage regions. Alternatively, ESD layer 120 may entirely be a logic chip, such as a controller, with no memory storage ability. One or more of the semiconductor chips 130 may also be logic chips. In another embodiment, ESD layer 120 may be an interposer chip having no logic or memory capability, but that serves merely to pass signals via pad region 30-2 from the substrate 110 to semiconductor chips 130 and includes ESD circuitry to perform electrostatic discharge functions described herein.

In one embodiment, as shown in FIG. 2, because ESD layer 120 includes the vertical electrical connection region 121 and an additional ESD circuit region 122, and none of the semiconductor chips 130 include ESD circuitry or an ESD circuit region, ESD layer 120 may have a larger size (e.g., larger area) than the semiconductor chips 130. However, in another embodiment, ESD layer 120 may have the same size as semiconductor chips 130, and may include, for example, redistribution circuitry to allow the pad region 30-1 of the semiconductor chips 130 to be the same size (e.g., have the same area) as the pad region 30-2 of the ESD layer 120.

Figure 5:
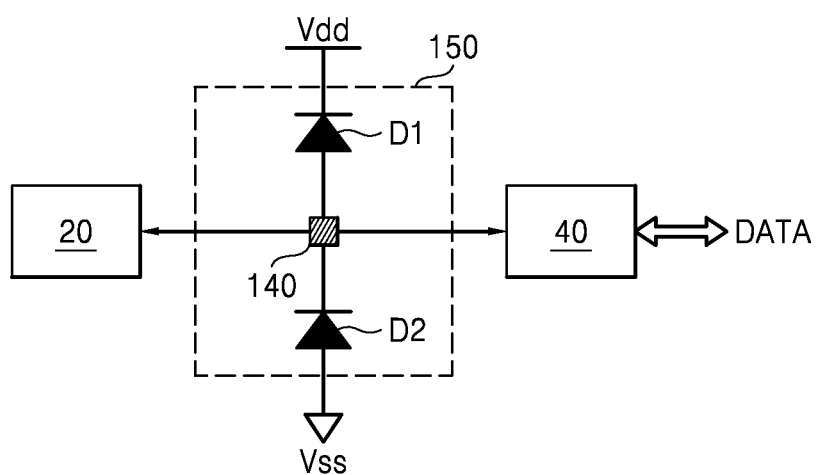
FIG. 5 is a circuit diagram of an ESD circuit illustrated in FIG. 4, according to certain exemplary embodiments.

FIG. 5 is a circuit diagram of each of the ESD circuits 150 illustrated in FIG. 4, according to certain exemplary embodiments. As shown in FIG. 5, each ESD circuit 150 may include at least one diode connected to one of the through vias 140 formed in the pad region 30-2 of the ESD layer 120. The at least one diode may be implemented, for example, by a diode-connected transistor.

In one embodiment, the ESD circuit 150 includes a first diode D1 connected between a corresponding one of the through vias 140 and a power line supplying a power supply Vdd, and a second diode D2 connected between the corresponding one of the through vias 140 and a ground Vss. For example, in one embodiment, a cathode of the first diode D1 is connected to the power line and an anode of the first diode D1 is connected to the corresponding one of the through vias 140. In addition, a cathode of the second diode D2 is connected to the corresponding one of the through vias 140 and an anode of the second diode D2 is connected to the ground Vss.

For clarity of the description, the core regions 20 and the peripheral regions 40 are also illustrated together with the ESD circuit 150 of the pad region 30-2 in the ESD layer 120 in FIG. 5. Referring to FIGS. 1 through 5, when static electricity occurs in the semiconductor device 10, the ESD circuit 150 formed in the pad region 30-2 of the ESD layer 120 discharges the static electricity to the ground Vss, thereby protecting the core regions 20 and the peripheral regions 40 of both the ESD layer 120 and the chip layers 130 from the static electricity.

Figure 6:
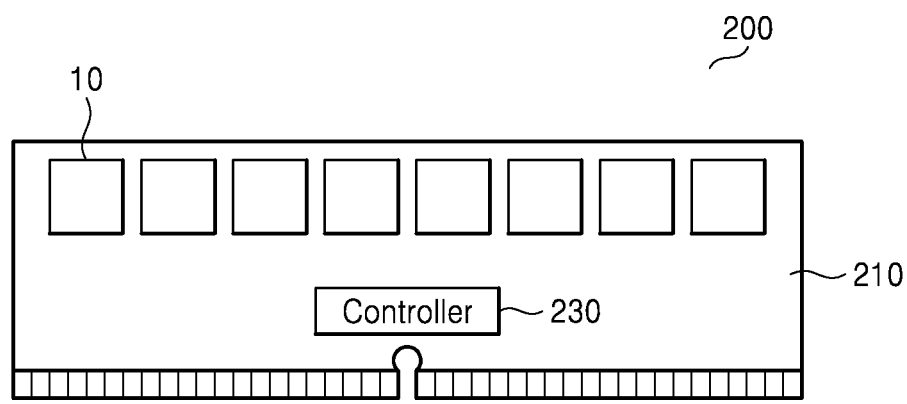
FIG. 6 is a diagram of a memory module including the semiconductor device illustrated in FIG. 1, according to certain exemplary embodiments.

FIG. 6 is a diagram of a memory module 200 including the semiconductor device 10 illustrated in FIG. 1, according to certain exemplary embodiments. Referring to FIG. 6, the memory module 200 includes a module substrate 210 and a plurality of semiconductor devices 10 mounted on the module substrate 210.

In one embodiment, the structure and the operations of the semiconductor devices 10 are substantially the same as those of the semiconductor device 10 described with reference to FIGS. 1 through 5. According to some embodiments, the memory module 200 may also include an additional controller 230 controlling the operations of the semiconductor devices 10. The memory module 200 may be implemented, for example, by a single in-line memory module (SIMM), a dual in-line memory module (DIMM), or small outline dual in-line memory module (SO-DIMM).

Figure 7:
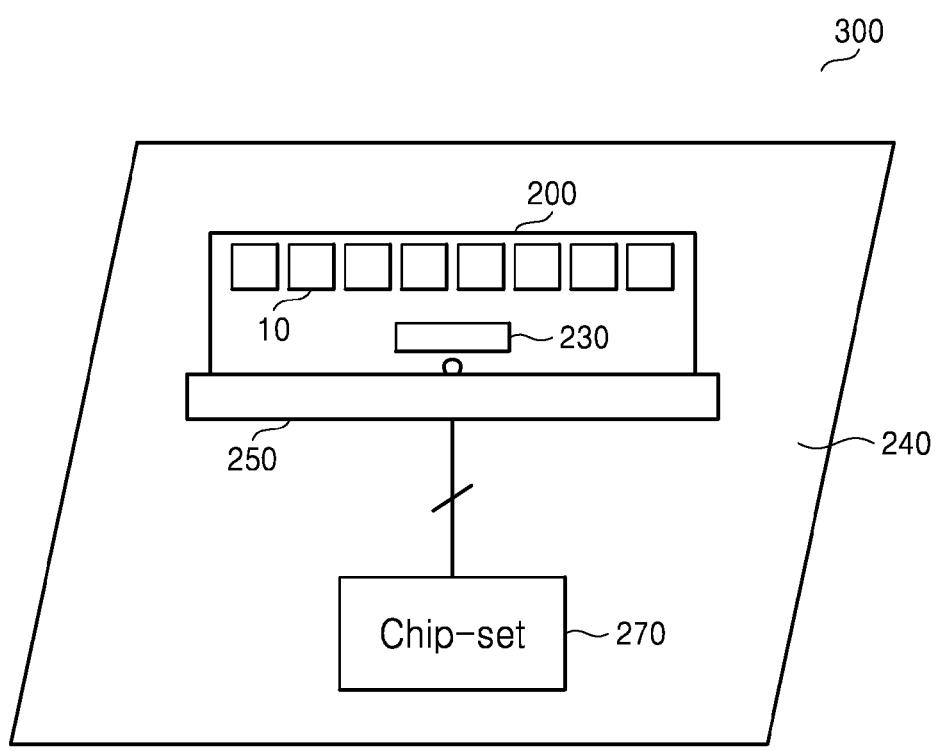
FIG. 7 is a diagram of a memory system including the memory module illustrated in FIG. 6, according to certain exemplary embodiments.

FIG. 7 is a block diagram of a memory system 300 including the memory module 200 illustrated in FIG. 6, according to certain disclosed embodiments. The memory system 300 may be implemented as a computer system such as a personal computer (PC), a tablet PC, laptop computer, or a mobile computing device (e.g., mobile phone, PDA, personal media player, etc.). The memory system 300 includes a main board 240, a slot 250 mounted on the main board 240, the memory module 200 inserted into the slot 250, and a processor included in a chip-set 270, which controls the operations of the semiconductor devices 10 included in the memory module 200 through the slot 250. The chip-set 270 may send data to or receive data from the semiconductor devices 10 through a data bus and the slot 250.

Figure 8:
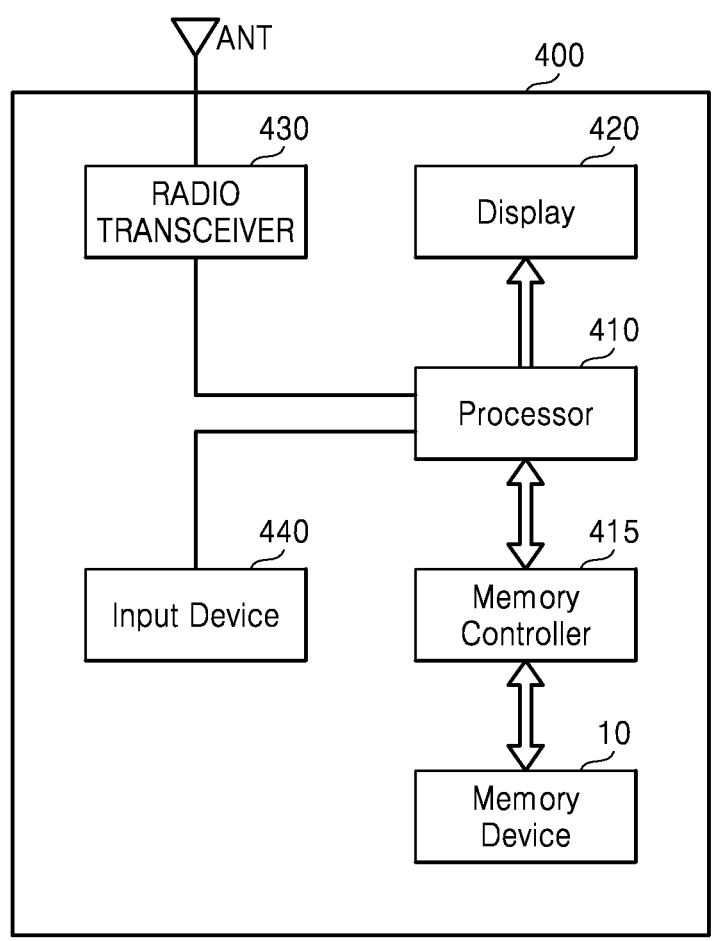
FIG. 8 is a block diagram of a memory system including the semiconductor device illustrated in FIG. 1 according to certain exemplary embodiments.

FIG. 8 is a block diagram of a memory system 400 including the semiconductor device 10 illustrated in FIG. 1 according to certain exemplary embodiments. Referring to FIG. 8, the memory system 400 may be implemented, for example, as a cellular phone, a smart phone, a tablet PC, a portable device, or a wireless Internet device. The memory system 400 includes the semiconductor device 10, a processor 410 controlling the data processing operation of the semiconductor device 10, and a memory controller 415 controlling the data access operation, e.g., a write operation or a read operation, to the semiconductor device 10 in compliance with the processor 410. The processor 410 controls an operation of the memory controller 415.

Data stored in the semiconductor device 10 may be controlled by the processor 410 or the memory controller 415 to be displayed through a display 420. A radio transceiver 430 may transmit or receive a radio signal through an antenna ANT. For example, the radio transceiver 430 may also convert a radio signal received through the antenna ANT into a signal that can be processed by the processor 410. Accordingly, the processor 410 may process a signal output from the radio transceiver 430 and store the processed signal in the semiconductor device 10 through the memory controller 415 or display the processed signal through the display 420. In addition, the radio transceiver 430 may convert a signal output from the processor 410 into a radio signal and output the radio signal through the antenna ANT.

An input device 440 allows a control signal for controlling the operation of the processor 410 or data to be processed by the processor 410 to be input to the memory system 400 and may be implemented by a pointing device such as a touch pad or a computer mouse, a keypad, or a keyboard. The processor 410 may control the operation of the display 420 to display data output from the semiconductor device 10, data output from the radio transceiver 430, or data output from the input device 440.

Figure 9:
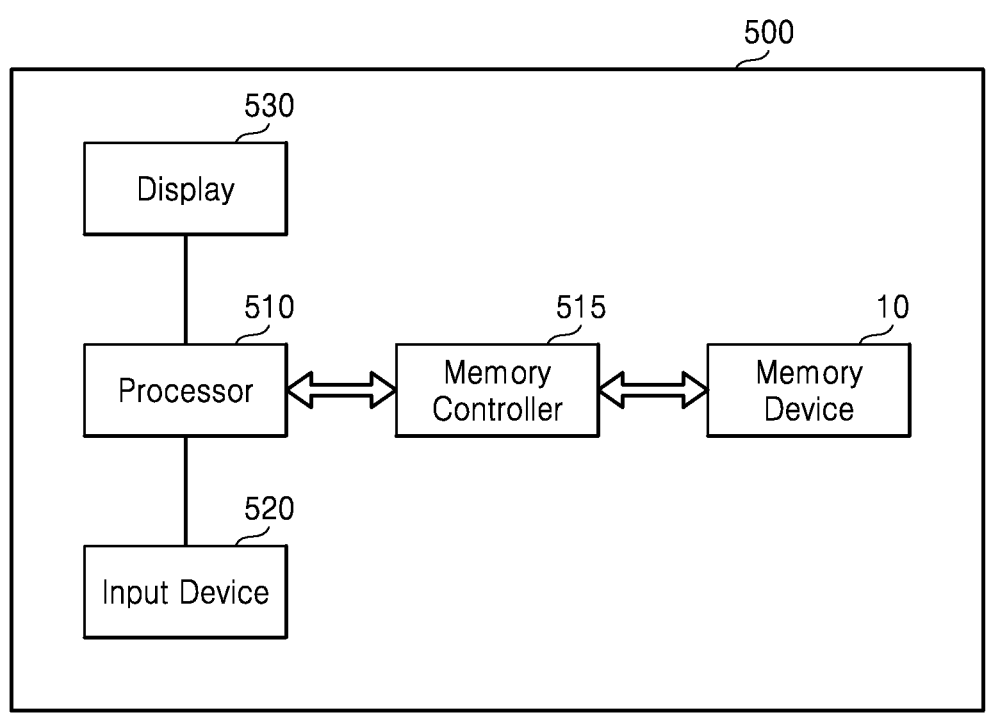
FIG. 9 is a block diagram of a memory system including the semiconductor device illustrated in FIG. 1 according to other exemplary embodiments.

FIG. 9 is a block diagram of a memory system 500 including the semiconductor device 10 illustrated in FIG. 1, according to other exemplary embodiments. Referring to FIG. 9, the memory system 500 may be implemented as a data processor such as a tablet personal computer, a net-book, an e-reader, a personal digital assistant (PDA), a portable multimedia player (PMP), an MP3 player, or an MP4 player. The memory system 500 includes the semiconductor device 10 and a processor 510 controlling the data processing operation of the semiconductor device 10.

The processor 510 may display data stored in the semiconductor device 10 through a display 530 in response to an input signal generated by an input device 520. The memory controller 515 may control the data access to the semiconductor device 10 in compliance with the processor 510. The input device 520 may be implemented by a pointing device such as a touch pad or a computer mouse, a keypad, or a keyboard.

Figure 10:
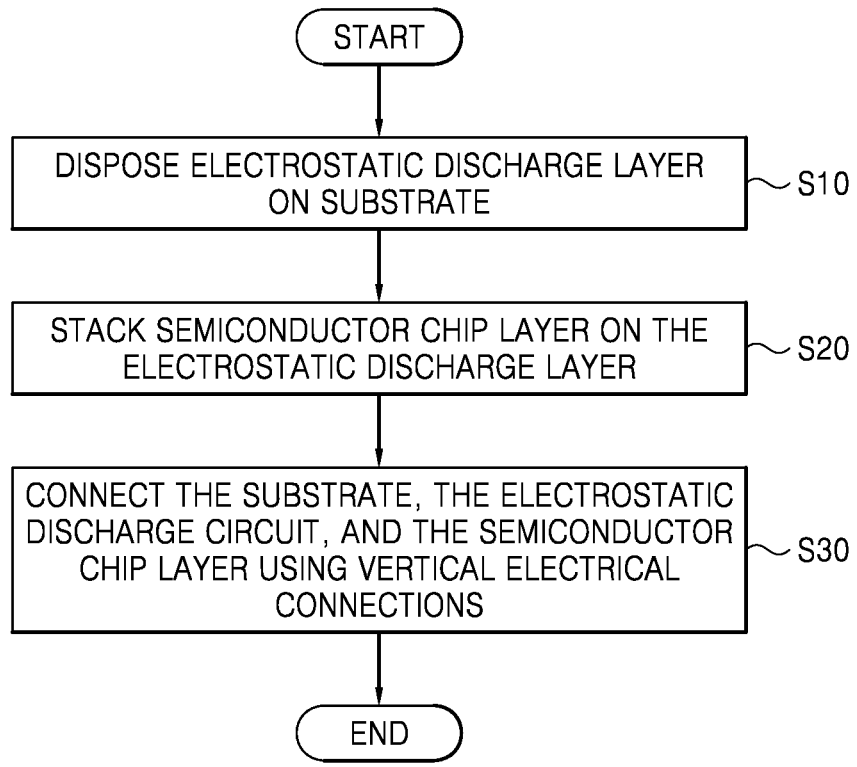
FIG. 10 is a flowchart of a method of fabricating the semiconductor device illustrated in FIG. 1 according to certain exemplary embodiments.

FIG. 10 is a flowchart of a method of fabricating the semiconductor device 10 illustrated in FIG. 1, according to certain exemplary embodiments. Referring to FIGS. 1 through 5 and FIG. 10, the ESD layer 120 including the ESD circuits 150 is disposed on the substrate 110 in operation S10.

The one or more semiconductor chip layers 130-1 through 130-$m$ are then stacked on the ESD layer 120 in operation S20. The semiconductor substrate 110, the ESD circuits 150 formed in the pad region 30-2 of the ESD layer 120, and the one or more semiconductor chip layers 130-1 through 130-$m$ are connected with one another through the vertical electrical connections 140 in operation S30. Each of the ESD circuits 150 may include the first diode D1 connected between a corresponding one of the vertical electrical connections 140 and the power line supplying the power Vdd and the second diode D2 connected between the corresponding one of the vertical electrical connections 140 and the ground Vss.

As described above, according to some embodiments, a semiconductor device includes an ESD layer between a semiconductor substrate and one or more semiconductor chip layers, including ESD circuitry formed in a vertical electrical connection region, thereby protecting internal circuits formed in the one or more semiconductor chip layers from external static electricity.

While the present disclosure has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A semiconductor device comprising:
a package substrate;
a first semiconductor chip comprising an electrostatic discharge layer, the first semiconductor chip stacked on the substrate and comprising a plurality of electrostatic discharge circuits;
at least one second semiconductor chip stacked on the first semiconductor chip, such that first semiconductor chip including the electrostatic discharge layer is between the package substrate and the at least one second semiconductor chip; and
a plurality of vertical electrical connections which pass through the at least one second semiconductor chip and first semiconductor chip including the electrostatic discharge layer to connect the at least one second semiconductor chip to the package substrate, the vertical electrical connections being connected, at the first semiconductor chip, to the electrostatic discharge circuits, respectively.

2. The semiconductor device of claim 1, wherein each of the electrostatic discharge circuits comprises at least one diode connected to a respective vertical electrical connection.

3. The semiconductor device of claim 1, wherein each of the electrostatic discharge circuits comprises at least one diode-connected transistor connected to a respective vertical electrical connection.

4. The semiconductor device of claim 1, wherein each of the electrostatic discharge circuits comprises:
a first diode connected between a corresponding one of the vertical electrical connections and a power line supplying a power supply; and
a second diode connected between the corresponding one of vertical electrical connections and a ground.

5. The semiconductor device of claim 4, wherein a cathode of the first diode is connected to the power line and an anode of the first diode is connected to the corresponding one of the vertical electrical connections; and
a cathode of the second diode is connected to the corresponding one of the vertical electrical connections and an anode of the second diode is connected to the ground.

6. The semiconductor device of claim 1, wherein each of the vertical electrical connections is a through via.

7. A memory module comprising:
the semiconductor device of claim 1; and
a module substrate on which the semiconductor device is mounted.

8. The memory module of claim 7, wherein each of the electrostatic discharge circuits comprises at least one diode connected to a respective vertical electrical connection.

9. The memory module of claim 7, wherein each of the electrostatic discharge circuits comprises:
a first diode connected between a corresponding one of the vertical electrical connections and a power line supplying a power supply; and
a second diode connected between the corresponding one of the vertical electrical connections and a ground.

10. A memory system comprising:
the memory module of claim 7;
a slot mounted on a main board and into which the memory module is inserted; and
a processor mounted on the main board to control an operation of the semiconductor device of the memory module.

11. A memory system comprising:
the semiconductor device of claim 1; and
a memory controller configured to control an operation of the semiconductor device.

12. The memory system of claim 11, wherein each of the electrostatic discharge circuits comprises:
a first diode connected between a corresponding vertical electrical connection and a power line supplying a power supply; and
a second diode connected between the corresponding vertical electrical connections and a ground.

13. A semiconductor package, comprising:
a package substrate, the package substrate having external terminals at a first surface, and connected to a plurality of through substrate vias at a second, opposite surface;
a first set of one or more semiconductor chips including at least a first semiconductor chip, the first set of one or more semiconductor chips stacked on the second surface of the package substrate, the first semiconductor chip connected to the plurality of through substrate vias;
a second semiconductor chip disposed between the package substrate and the first set of one or more semiconductor chips, the second semiconductor chip including a plurality of electrostatic discharge circuits, each electrostatic discharge circuit electrically connected to at least a first of the through substrate vias, wherein
each of the through substrate vias, including the first through substrate via, extend from the package substrate to the first set of one or more semiconductor chips, and pass through the second semiconductor chip.

14. The semiconductor package of claim 13, wherein:
the first semiconductor chip is a semiconductor memory chip; and
the second semiconductor chip includes logic circuitry.

15. The semiconductor package of claim 14, wherein:
the first semiconductor chip is a slave chip; and
the second semiconductor chip is a master chip.

16. The semiconductor package of claim 13, wherein:
each electrostatic discharge circuit includes at least one diode electrically connected to a through substrate via.

17. The semiconductor package of claim 13, wherein:
the first set of one or more semiconductor chips includes at least a third semiconductor chip; and
the first and third semiconductor chips do not include any electrostatic discharge circuits.

18. A semiconductor device, comprising:
a package substrate;
at least one semiconductor chip disposed on the package substrate;
an electrostatic discharge (ESD) chip disposed between the package substrate and the at least one semiconductor chip; and
through vias connected to the package substrate and the at least one semiconductor chip and passing through the ESD chip;
wherein the ESD chip includes a set of one or more electrostatic discharge circuits connected to the through vias, and
wherein the set of one or more electrostatic discharge circuits is located at a first area of the ESD chip, and the through vias are located at a second area of the ESD chip separate from the first area.

19. The semiconductor device of claim 18, wherein:
the ESD chip includes a pad region in the first area at which the set of one or more electrostatic discharge circuits are disposed, and further includes a core memory region and a peripheral region.

20. The semiconductor device of claim 1, wherein, at the first semiconductor chip:
the plurality of vertical electrical connections are located at a first area of the first semiconductor chip; and
the plurality of electrostatic discharge circuits are located at a second area of the first semiconductor chip separate from the first area.

* * * * *